United States Patent
Pietsch

(10) Patent No.: US 8,398,878 B2
(45) Date of Patent: Mar. 19, 2013

(54) METHODS FOR PRODUCING AND PROCESSING SEMICONDUCTOR WAFERS

(75) Inventor: Georg Pietsch, Burghausen (DE)

(73) Assignee: Siltronic AG, Munich (DE)

( * ) Notice: Subject to any disclaimer, the term of this patent is extended or adjusted under 35 U.S.C. 154(b) by 370 days.

(21) Appl. No.: 12/754,846

(22) Filed: Apr. 6, 2010

(65) Prior Publication Data

US 2010/0323586 A1 Dec. 23, 2010

(30) Foreign Application Priority Data

Jun. 17, 2009 (DE) .................. 10 2009 025 243

(51) Int. Cl.
*C03C 15/00* (2006.01)

(52) U.S. Cl. ............ 216/88; 216/89; 438/692; 438/693; 451/283; 451/285; 451/287

(58) Field of Classification Search .................... 216/88; 438/692, 693; 451/283, 285, 287
See application file for complete search history.

(56) References Cited

U.S. PATENT DOCUMENTS

| | | | |
|---|---|---|---|
| 4,739,589 A | 4/1988 | Brehm et al. | |
| 5,152,917 A | 10/1992 | Pieper et al. | |
| 5,665,656 A * | 9/1997 | Jairath ........................ | 438/692 |
| 5,738,574 A | 4/1998 | Tolles et al. | |
| 5,827,779 A | 10/1998 | Masumura et al. | |
| 6,007,407 A | 12/1999 | Rutherford et al. | |
| 6,124,704 A | 9/2000 | Annema | |
| 6,299,514 B1 | 10/2001 | Boller | |
| 6,419,556 B1 * | 7/2002 | Urbanavage et al. .......... | 451/41 |
| 6,530,826 B2 * | 3/2003 | Wenski et al. .................. | 451/41 |
| 7,011,567 B2 * | 3/2006 | Gerber ............................ | 451/11 |
| 7,344,434 B2 * | 3/2008 | Chen et al. ..................... | 451/285 |
| 2002/0055324 A1 | 5/2002 | Wenski et al. | |
| 2002/0197945 A1 | 12/2002 | Nevoret et al. | |
| 2003/0013389 A1 | 1/2003 | Hollatz et al. | |

(Continued)

FOREIGN PATENT DOCUMENTS

| DE | 10007390 A1 | 10/2000 |
|---|---|---|
| DE | 10132504 C1 | 10/2002 |

(Continued)

OTHER PUBLICATIONS

S.Wolf et al. Silicon Processing for the VLSI Era, vol. 4 Lattice Press (1986), pp. 354-361 and 375-377.*

(Continued)

*Primary Examiner* — Lan Vinh
*Assistant Examiner* — Maki Angadi
(74) *Attorney, Agent, or Firm* — Brooks Kushman P.C.

(57) ABSTRACT

Semiconductor wafers are polished by a material-removing polishing process A, on both sides of the wafer, using an abrasive-free polishing pad, and a polishing agent which contains abrasive; and a material-removing polishing process B, on at least one side of the wafer, using a polishing pad with a microstructured surface containing no materials which contact the wafer which are harder than the semiconductor material, and a polishing agent is added which has a pH≧ to 10 and contains no substances with abrasive action. Preferred is a method for producing a semiconductor wafer, comprising the following ordered steps: separating a semiconductor single crystal into wafers; simultaneously processing both sides of the wafer by chip-removing processing; polishing the wafer, comprising a polishing process A and a polishing process B; and CMP of one side of the wafer, removing <1 μm.

27 Claims, 3 Drawing Sheets

U.S. PATENT DOCUMENTS

| | | |
|---|---|---|
| 2003/0054650 A1 | 3/2003 | Wenski et al. |
| 2003/0060050 A1 | 3/2003 | Pietsch et al. |
| 2003/0126801 A1 | 7/2003 | Kamboj |
| 2004/0235402 A1 | 11/2004 | Bjelopavlic et al. |
| 2008/0014839 A1 | 1/2008 | Pietsch et al. |
| 2009/0029552 A1 | 1/2009 | Schwandner et al. |

FOREIGN PATENT DOCUMENTS

| | | |
|---|---|---|
| DE | 10142400 A1 | 3/2003 |
| DE | 102006032455 A1 | 4/2008 |
| DE | 102007035266 A1 | 1/2009 |
| EP | 0208315 A1 | 1/1987 |
| JP | 9174418 A | 7/1997 |
| JP | 2001007063 A | 1/2001 |
| JP | 2002231669 A | 8/2002 |
| JP | 2003260663 A | 9/2003 |
| JP | 2004356336 A | 12/2004 |
| JP | 2006332281 A | 12/2006 |
| JP | 2007036225 A | 2/2007 |
| JP | 2008290197 A | 12/2008 |
| WO | 9924218 A1 | 5/1999 |
| WO | 9955491 A1 | 11/1999 |
| WO | 0047369 A1 | 8/2000 |

OTHER PUBLICATIONS

Hydrogen on SI: Ubiquitous surface termination after wet-chemical processing. G .J. Pietsch. Philipps—Universilät, Renthof 5, D-35032 Marburg Germany. Mar. 31, 1994.

Crystals Growth—from Fundamentals to Technology. G. Müller. J.-J. Métois and P. Rudolph p. 239-270, Jul. (2004).

\* cited by examiner

METHODS FOR PRODUCING AND PROCESSING SEMICONDUCTOR WAFERS

CROSS-REFERENCE TO RELATED APPLICATIONS

This application claims priority to German Patent Application No. 10 2009 025 243.6 filed Jun. 17, 2009 which is herein incorporated by reference.

BACKGROUND OF THE INVENTION

1. Field of the Invention

The invention relates to a method for producing a semiconductor wafer and also to a method for processing a semiconductor wafer.

2. Background Art

Semiconductor wafers as substrates for particularly demanding components having $\leq 22$ nm minimum structure length, that is to say the 22 nm Design Rule according to the ITRS ("International Technology Roadmap for Semiconductors"), have to be particularly flat. The flatness of previous wafers is limited by a decrease in thickness in the wafer edge region ("edge roll-off") and by non-uniform material removal resulting from fluctuations in the local bond strength, e.g. on account of radially fluctuating dopant incorporation as early as during the crystal pulling process. These wafers are therefore unsuitable for $\leq 22$ nm structures. What is essentially responsible for both effects is the chemical mechanical polishing process that is used at the end of each chain of process steps for producing substrate wafers according to the prior art in order to remove residual damage of the crystal structure of layers near the surface and to obtain a particularly low roughness.

In the prior art, the polishing process is carried out by relative movement between wafer and polishing pad under pressure, while supplying a polishing agent (slurry). The polishing agent usually contains colloidally dispersed silica sol in alkaline slurry, By contrast, the polishing pad contains no abrasive. The interplay between the mechanical grinding effect of the silica sol and the chemical attack of the alkaline polishing agent then effects material removal leading to the smoothing of the wafer surface.

Simultaneous chemical mechanical double-side polishing (DSP) is known in the prior art. In DSP, a plurality of semiconductor wafers are processed in material-removing fashion simultaneously on both sides between two colinear working disks. In this case, the working disks bear polishing pads which contain no substances with abrasive action, and a polishing agent containing substances with abrasive action is fed to the working gap formed between the working disks. Substances with abrasive action are characterized in that they are harder than the material of the workpiece. Silica sol ($SiO_2$) is preferably used in DSP. $SiO_2$ is harder than silicon. The silica sol is usually a colloid having grain sizes of the sol particles of between 5 nm and a few micrometers. During processing by DSP, one or a plurality of semiconductor wafers are inserted into a corresponding one or a plurality of thin guide cages that are moved by a rolling apparatus, which is formed from an inner and an outer toothed ring and which is arranged concentrically with respect to the working disks, in the working gap. The semiconductor wafers describe characteristic cycloidal trajectories on the surfaces of the working disks (planetary gear kinematics). Material removal is brought about by relative movement of polishing pad and semiconductor wafer under load and the frictional effect of the polishing agent.

One exemplary embodiment of DSP of silicon wafers is disclosed in US 2003/054650A. A suitable apparatus for such a DSP polishing process is presented in DE 100 07 390 A1. Suitable guide cages for the semiconductor wafers, so-called "carriers", are described in EP 208 315 B1. Finally, a suitable polishing pad is known from U.S. Pat. No. 4,927,432.

The prior art likewise discloses a method called "Fixed-Abrasive Polishing" (FAP) for the planarization of "interlayer dielectrics" (ILD), in which a pad is used which has additives which come into contact with the surface to be processed and which are harder than the surface material thereby processed. This is described for example in WO 99/55491. An interlayer dielectric consists e.g. of a field oxide (soft silicon oxide) grown by deposition of e.g. TEOS (tetraethoxysilane) on a semiconductor structure in order to isolate different wiring layers from one another.

Likewise known is "Fixed-Abrasive Polishing (FAP) for the isolation of shallow trench isolation" (STI), e.g. described in US 2008/0153392 A1, in which a pad is likewise used which contains additives which come into contact with the surface to be processed and which are harder than the material of the processed workpiece surface, typically $Si_3N_4$ and various metals (Cu, $M_H$ 2.5; W, $M_H$~4) for electrical through-plating.

DE 10 2007 035 266 A1 discloses a method for polishing a substrate composed of semiconductor material comprising two-stage FAP polishing, wherein in a first step a polishing agent solution without abrasive substances and in a second step a polishing agent slurry with abrasive substances is brought between FAP polishing pad and substrate. The method can comprise an additional CMP step (pad without abrasives, polishing agent slurry with abrasives).

The abovementioned FAP methods are grinding methods, cf. U.S. Pat. No. 6,824,451 B2.

According to DIN 8580, "grinding" is understood to be a separating method in which the form of a workpiece is changed by eliminating the material cohesion by means of mechanical action at the processing location. A material particle removed by mechanical action is referred to as a chip. Examples of chip-removing processing methods include grinding, sawing, filing, cutting, turning, milling, drilling, planing and shearing. Grinding is distinguished from them in that the chipping takes place by means of a geometrically indeterminate cutting edge since many abrasive bodies are in engagement with random orientation of their cutting edges, whereas in the case of sawing, filing, turning, milling, drilling and planing, only one or a few cutting edges are in engagement with predetermined orientation with respect to the workpiece surface. A cutting edge that can change the material cohesion of the workpiece is distinguished by the fact that it is composed of a material that is harder than that of the workpiece.

In the prior art of FAP methods, the wear of the abrasive bodies results from microfracture, whereby new cutting edges are constantly produced, and from liberation of abrasive grain, whereby new layers of fresh abrasive grain are exposed. This mechanism is described for example in U.S. Pat. No. 6,824,451 B2. Grinding methods are distinguished by the fact that they produce crystal defects. These are brittle fracture crack systems, lattice dislocations, mosaics (small-angle grain boundaries), surface layers with amorphized structure, scratches, etc.

In chemical or chemical mechanical processing methods according to the prior art, the reaction of the etchant or polishing agent with the semiconductor surface brings about material removal. Examples of etchants include HF and $HNO_3$ (acidic etching) or KOH, TMAH (tetramethylammonium hydroxide), NaOH etc. (alkaline etching). Polishing agents contain OH— as a reactant (alkaline silica sol). In this case, the reaction depends on the transport of the reactive starting substances within the etching or polishing liquid and to the semiconductor surface, on the temperature, on the concentration and, in particular, on the local material composition and on the material properties. Local material composition should be understood to mean the presence of oxides, metals or other materials alongside the semiconductor material used (e.g. silicon, germanium, III-V semiconductors, compound semiconductors). Material properties that influence the reaction are afforded for example by the presence of dopants and by the dopant concentrations.

Chemical mechanical polishing by means of silica sol known in the prior art brings about a material removal from the processed surface by means of a three-body interaction, namely between polishing pad, silica sol and the wafer surface. This three-body interaction has the effect that material removal is not effected in a path-determined manner, that is to say not exclusively along the path described by a point on the polishing pad over the workpiece surface, but rather is additionally determined by the dynamics of the silica sol particles in the polishing agent film established between pad and wafer surface; e.g. convection, turbulence, diffusion, etc. Non-path-determined processing is distinguished by the fact that the material removal is not deterministic, that is to say is determined only by the kinematics of the tool. This leads to an undesirably convex wafer form due to tapering of the wafer edge, owing to polishing agent depletion from the wafer edge to the wafer center or to locally preferential material removal at locations with chemically, structurally or electronically fluctuating properties.

The following are known in the prior art as further methods for processing semiconductor wafers in addition to those mentioned above:
- two-disk or plane-parallel lapping (for short: lapping) using loose grain, e.g. disclosed in US 2004/0043709 A1;
- plane-parallel grinding with lapping kinematics (Planetary Pad Grinding, PPG) using grain bonded in an easily changeable working layer ("abrasive pad"), e.g. explained in DE 10 2006 032 455 A1, suitable abrasive pads being described e.g. in U.S. Pat. No. 6,007,407 and U.S. Pat. No. 6,599,177 B2;
- simultaneous double-side grinding between two colinearly arranged cup grinding disks (Double-Disk Grinding, DDG), e.g. explained in US 2003/0060050 A1;
- Single-Side Grinding (SSG), also called surface rotation grinding, or Single-Side Fine-Grinding, SSFG), implemented as single-side processing step or processing step on both sides by means of sequential single-side processing of the front and rear sides of the semiconductor wafer, e.g. explained in EP 272 531 A1.

In the prior art, the production of an always primarily convex wafer form cannot be avoided since the polishing agent always has to be fed to the working gap between wafer surface and pad surface via the edge of the wafer. A depletion of polishing agent therefore occurs from the edge to the center of the wafer. The material removal is thus greater at the edge than in the center of the wafer, which leads to an edge roll-off of the wafer thickness. In order that for future applications the wafer area can be used as intended (ITRS="International Technology Roadmap for Semiconductors") apart from an edge exclusion zone having a width of 1 mm, it should be endeavored to avoid such an edge roll-off if possible. The prior art still does not offer a convincing solution for this, on account of the problems outlined above.

It is furthermore known that during the pulling process, for example, dopant is incorporated with radially fluctuating density into the growing single crystal. This is described e.g. in W. Von Ammon: "Crystal Growth—From Fundamentals to Technology," SILICON CRYSTAL GROWTH, 2004, p. 239-270. The radially fluctuating dopant concentration leads to correspondingly radially fluctuating electronic properties of the wafers produced from the single crystal by means of slicing. In subsequent processing steps for planarizing the wafer, the material removal mechanism of which is based on electronic interaction, therefore experience a removal rate that fluctuates radially in accordance with the dopant concentration. This includes all chemical and chemo-mechanical processing steps, in particular etching and chemical mechanical polishing using silica sol. The electronic and electrochemical interactions and removal mechanisms during etching or polishing are described e.g. in APPL. PHYS. A 60, 347-363 (1995).

Since etching and, in particular, chemical mechanical polishing are the final processing steps, which therefore crucially determine the form of the wafer, semiconductor wafers produced in accordance with the closest prior art always have a more or less pronounced radially symmetrical flat modulation of the surface. Such height modulations make semiconductor wafers produced according to the prior art unsuitable as substrates for particularly demanding semiconductor components. This is because the latter are distinguished by particularly thin vertical functional and separating layers. The production of these layers involves repeated use of polishing processes for creating planar interlayers during component production. In the case of an uneven starting surface, break through in the separating layers can occur during polishing. As a result, short circuits arise in the microelectronic components thus produced, which makes the latter unusable.

In contrast to etching or chemical mechanical polishing, grinding and lapping have none or only very little and harmlessly pronounced preferential material removal at electronically modulated regions, for the removal mechanism underlying these processes is a purely mechanical one by means of structural separation by chip removal: in the case of grinding by actual chipping by means of fixedly bonded abrasive, and in the case of lapping by brittle erosive structural fatigue by means of free grain in a slurry.

SUMMARY

A first object of the present invention is to provide a method that achieves high flatness right through to the edge of the semiconductor wafer. The further object consists in avoiding short-wave concentric unevenesses of the wafer surface. These and other objects of the invention are achieved by means of a first method for processing a semiconductor wafer, comprising a polishing process A, which effects material-removing processing of both sides of the semiconductor surface simultaneously and in which a polishing pad is used which contains no substances with abrasive action, and in which a polishing agent is added which contains substances with abrasive action; and a polishing process B, which effects material-removing processing of either one or both sides of the semiconductor wafer and in which a polishing pad is used which has a microstructured surface and which contains no materials coming into contact with the semiconductor wafer which are harder than the semiconductor material, and in which a polishing agent is added which has a pH value of greater than or equal to 10 and which contains no substances with abrasive action.

DETAILED DESCRIPTION OF THE PREFERRED EMBODIMENTS

Figure 1:
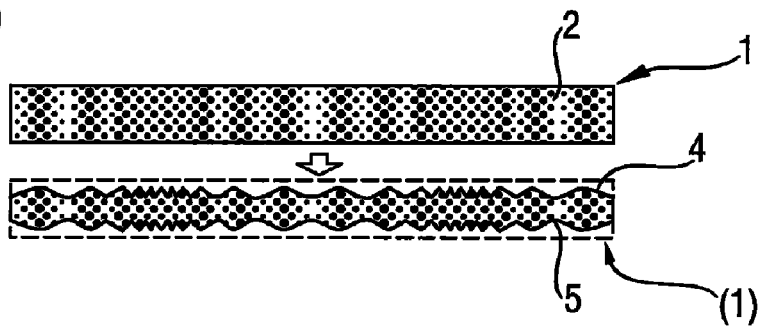
FIG. 1: Semiconductor wafer with dopant fluctuation and its effect on the surface topology: A) after processing not according to the invention, B) after processing according to the invention.
Figure 1:
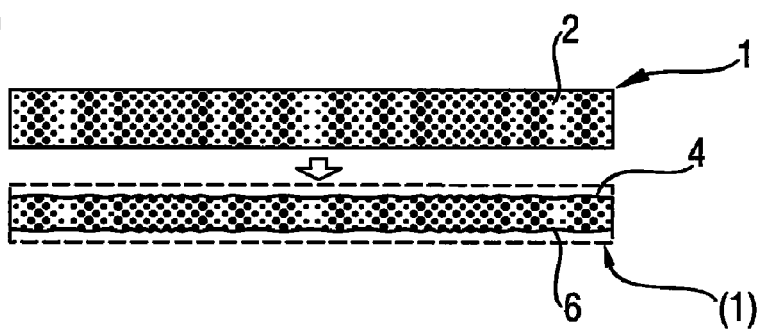

The polishing process B is a specially adapted polishing process using a microstructured pad. Polishing process A corresponds to a chemical mechanical double-side polishing process using preferably a silica sol polishing slurry.

The method according to the invention differs from the method described in DE 10 2007 035 266 A1 in that, instead of two FAP polishing processes (one using polishing agent with abrasives, and one without abrasives) and an optional additional CMP polishing step, only one specially adapted polishing step using the microstructured pad, which succeeds or precedes a chemical mechanical double-side polishing process (DSP), is provided. What is essential to the success of the claimed method is a pH value of greater than or equal to 10 for the polishing agent solution during the polishing process using a microstructured pad and the fact that the materials and pad components coming into contact with the workpiece have a lower hardness than the semiconductor material to be polished. With the use of a polishing agent slurry containing abrasives as in the FAP polishing process in DE 10 2007 035 266 A1, the method according to the invention would be unsuccessful.

By way of example, silicon has a Mohs hardness of 6.5. When polishing silicon wafers, therefore, a polishing pad with abrasives composed of a material having a hardness lower than 6.5 should in any event be used.

Examples of suitable abrasives include feldspars, $(Ba,Ca,Na,K,NH_4)(Al,B,Si)_4O_8$, having a Mohs hardness ($M_H$) of approximately 6, but in particular also softer materials, in particular minerals, such as apatites, $Ca_5(PO_4)_3(F,Cl,OH)$, some of the softer allanites $(Ca,Ce,La,Y)_2(Al,Fe)_3(SiO_4)_3(OH)$ ($M_H$=5 ... 7), bastnaesite, $(Ce,La,Y)[(CO_3)F]$ ($M_H$= 4 ... 4.5), monazite, $(Ce,La,Nd)PO_4$ ($M_H$=5 ... 5.5), barium carbonate, $BaCO_3$ ($M_H$=3.5), barium sulfate, $BaSO_4$ ($M_H$= 3 ... 3.5), wollastonite (calcium silicate, $CaSiO_3$, $M_H$=4 ... 5), cerium, yttrium, scandium or ytterbium oxide ($CeO_2$, $M_H$=6; $Y_2O_3$; $Sc_2O_3$; $Yb_2O_3$) and many other materials, preferably minerals, having a Mohs hardness $M_H$<6.5.

The object is likewise achieved by means of a second method according to the invention for producing a semiconductor wafer, comprising the following steps in the order indicated:

(a) separating a semiconductor single crystal into wafers;
(b) simultaneously processing both sides of the semiconductor wafer by means of chip-removing processing;
(c) polishing the semiconductor wafer, comprising a polishing process A, which effects material-removing processing of both sides of a semiconductor surface simultaneously and in which a polishing pad is used which contains no substances with abrasive action, and in which a polishing agent is added which contains substances with abrasive action; and a polishing process B, which effects material-removing processing of either one or both sides of the semiconductor surface and in which a polishing pad is used which has a microstructured surface and which contains no materials coming into contact with the semiconductor surface which are harder than the semiconductor surface, and in which a polishing agent is added which has a pH value of greater than or equal to 10 and which contains no substances with abrasive action;
(d) chemical mechanical polishing of one side of the semiconductor wafer, wherein less than 1 μm is removed.

In polishing process B of the first method according to the invention and in polishing process B in step c) of the second method according to the invention, at least one side of one or more semiconductor wafers is guided over a rotating working disk under pressure, with rotation and optionally with an additional radial oscillation movement. In this case, the working disk bears a polishing pad whose surface is microstructured and contains no substances coming into contact with the semiconductor surface which are harder than the semiconductor surface to be processed, and a polishing agent having a pH value $\leq 10$ and containing no substances with abrasive action is fed to the contact zone formed from semiconductor surface and polishing pad surface. Preferably, in this case a so-called retainer ring surrounds the semiconductor wafer and prevents floating away or bursting during processing. A polishing apparatus suitable for this purpose is described in U.S. Pat. No. 5,738,574.

The prior art discloses polishing pads which can be used for polishing process B. By way of example, suitable microstructured pads are described in WO 9924218 or U.S. Pat. No. 5,152,917.

These pads have surfaces with regularly arranged uniform local elevations, that is a periodic arrangement of "islands", separated by "trenches". These microstructures are produced by embossing. Likewise suitable are polishing pads in which a microstructuring of their surface is brought about by lateral modulation of the pad hardness or local elasticity, e.g. by variation of the material mixture, by variation of the addition of suitable fillers, by mechanical compression, locally varying curing of the synthetic resin mixture or admixture of suitable fibers, etc.

Pads suitable for carrying out polishing process B are characterized in that they contain no additives coming into contact with the wafer surface which are harder than the material of the workpiece. Pads containing additives coming into contact with the wafer surface which are harder than the material of the wafer surface are unsuitable for carrying out the method according to the invention since these hard additives lead to undesirable scratches, roughness and crystal damage, etc., which would necessitate post-processing. The advantages according to the invention would be nullified, however, by a post-processing, e.g. by means of a further chemical mechanical polishing using silica sol in accordance with the prior art, cf. DE 10 2007 035 266 A1.

In FAP methods for ILD planarization, cf. WO 99/55491, the field oxide has a Mohs hardness of between 3 and 5. Additives composed e.g. of $\alpha$-$Al_2O_3$ (Mohs hardness $M_H$ 9); $\gamma$-$Al_2O_3$ ($M_H$ 8); SiC ($M_H$ 9.5); quartz-like $SiO_2$ ($M_H$ 7); $CeO_2$ ($M_H$ 6) or other materials are added to the FAP pad. The additives are therefore composed of materials which are harder than the material to be processed. By contrast, the methods according to the invention are successful only if precisely this is avoided.

In polishing process B of the first method according to the invention and in polishing process B in step c) of the second method according to the invention, also referred to hereinafter as the polishing process using a microstructured pad that is essential to the invention, the material removal is effected by means of two-body interaction, namely between microstructured pad surface and the workpiece surface. The material-removal is effected in a path-determined manner and therefore deterministically. No crystal defects owing to chip-removing processing occur.

The invention is described in detail below with reference to the figures.

1: Semiconductor wafer
2: Locally fluctuating dopant concentration
4: Non-uniform material removal
5: Surface unevenness
6: Surface flatness
7: Convex form after DSP
8: Plane-parallel form after processing by the first method according to the invention
9: Convex form after DSP+CMP
10: Plane-parallel form after processing by the second method according to the invention
11: Holding apparatus for a semiconductor wafer during polishing
12: Retainer ring
13: Polishing pad, abrasive pad
14: Colloidally dispersed silica sol
15: Depletion, wear, reduction of the silica sol
16: Front-side decrease in thickness at the edge of the semiconductor wafer
17: Rear-side decrease in thickness at the edge of the semiconductor wafer
18: Planoconvex form
19: Biconvex form
20: Semiconductor wafer with decrease in thickness at the edge
21: Prestretched pad
22: Front-side increase in thickness at the edge of the semiconductor wafer
23: Plane-parallel form after DSP polishing
24: Negative overhang of a semiconductor wafer The invention is directed to two-part polishing of a semiconductor wafer, comprising a polishing process A and a polishing process B (the polishing using a microstructured pad that is essential to the invention).

Polishing process A corresponds to a chemical mechanical polishing step e.g. using alkaline colloidally dispersed silica sol. This chemical mechanical polishing step is characterized in that less material is removed than would be necessary in the case of a comparative processing according to the prior art (conventional DSP) in order to completely remove the damage resulting from the previous processing steps. Such damage comprises disturbances in the crystallinity (Sub-Surface Damage), roughness and scratches resulting from previous chipping processing steps, and also deviations from the target form resulting from non-uniform removal in previous chemical processes, e.g. as a result of acidic or alkaline etching. The reduction in removal during this polishing step only becomes possible in the first place, however, when a second polishing step in accordance with the polishing process B is implemented downstream, during which further material is removed.

Polishing process B is then characterized in that the polishing pad has a microstructuring of its surface or a modulation of its local elasticity and this surface layer is applied on a stiff carrier. The microstructuring preferably comprises a periodic or random height modulation of the pad surface with correlation lengths of between 10 μm and 10 mm and an amplitude of 1 μm to 1 mm vertically. More preferably, the correlation length is between 50 and 5000 μm and the amplitude is between 10 and 250 μm. Modulation of the local elasticity of the pad surface is best achieved by local variation of the density or of the material composition of the surface layer.

Preferably, the pad also contains additional additives in the form of introduced solids which bring about a microstructuring by means of modulation of the elasticity (compliance), in which case, however, these solids, according to the invention, must be softer than the semiconductor surface to be processed. The processed semiconductor material is preferably silicon.

Additives which are added to the polishing pad in order to alter the elastic polishing pad properties and which can come into contact with the semiconductor surface preferably have a hardness of at most 6 Mohs. For the case of silicon polishing it is thus ensured that the additives are softer than the semiconductor surface to be processed.

Therefore, an embodiment of the polishing pad which has a microstructuring both in terms of its shaping and in terms of its elasticity is also preferred. On the underside, that is to say below the hard carrier layer, the pad can additionally have a further, soft layer ("Sub-Pad"), which compensates for non-uniformities in the polishing plate as long as the hardness set by the stiff carrier layer is not changed as a result. The hard carrier layer preferably behaves inelastically in a lateral length range up to 25 mm, particularly preferably in a lateral length range up to 10 mm.

Some of the commercially available polishing pads were tested for comparison. It was found that the method can be carried out according to the invention, and the object on which the invention is based can be achieved, only when the pad has the essential properties mentioned above. If the pad does not have any microstructuring, no material removal at all arises. If the pad contains additives which are harder than the semiconductor surface to be processed and come into contact with the latter, undesirable scratches can occur on the wafer surface. The desired low surface roughness and damage cannot be achieved in this way.

During the investigations, it was found that upon selecting suitable polishing pads and process parameters during the polishing using a microstructured pad that is essential to the invention, material removal can be obtained without a harmful parasitic abrasive effect (scratches, roughness, crystal damage) and without the undesirable properties of chemical mechanical polishing using colloidally dispersed silica sol (edge roll-off, short-wave unevenesses).

All the methods known in the prior art presuppose, by contrast, that a) either chip-removing material removal by means of grinding (large number of geometrically indeterminate cutting edges in engagement; abrasive grain harder than workpiece; e.g. FAP grinding of interlayer dielectrics) or b) chemical mechanical polishing using silica sol (chemically assisted, ultrafine lapping with addition of a polishing slurry containing abrasives) is carried out.

The fact that a gentle material-removing processing step that yields a smooth surface with little damage can be carried out without grinding or without abrasive slurry by means of the polishing using a microstructured pad that is essential to the invention, and the fact that this polishing, upon selection of suitable microstructuring of the polishing pads, is effected with an economical removal rate and deterministically in a path-determined manner, are extremely unexpected in view of the prior art.

It was furthermore found that the pH value of the polishing agent solution is also essential to the invention. Given a neutral pH value, no material removal is obtained during the polishing using a microstructured pad that is essential to the invention. This can be regarded as proof that no chip-removing interaction is involved in the material removal mechanism of this polishing, especially as it is known to the person skilled in the art that grinding (chipping) is essentially independent of the pH value of the cooling lubricant used and therefore yields a considerable material removal in particular even given a neutral pH value. This also explains why the undesirable surface defects can be avoided in the method according to the invention.

During the polishing essential to the invention using polishing pads whose surface is microstructured and which are free of material additives which possibly have an abrasive action and are mixed in to modify the mechanical pad properties, material removal is obtained, but only if the pH value is set to be significantly alkaline, namely with a pH value of at least 10.

It has been confirmed that the material removal during the polishing that is essential to the invention is effected in a substantially path-determined manner, namely only at the locations that are swept over by the microstructured polishing pad. In the prior art, a path-determined material removal had hitherto only been known from chip-removing processing: in this respect a surprising finding for the methods according to the invention presented here.

An extremely advantageous effect of the method is that a preferential chemical removal at the regions that are altered structurally (by means of crystal lattice strains or oxygen precipitates) or electronically (by means of dopant fluctuations) in terms of their chemical behavior, as is observed during chemical mechanical polishing using silica sol, is substantially suppressed during the polishing using a microstructured pad that is essential to the invention. The shortwave concentric unevennesses are significantly reduced in amplitude and markedness after the second polishing step that is essential to the invention.

Finally, the decrease in the thickness of the semiconductor wafer toward the edge ("edge roll-off") can be reduced. This is evidently due to the fact that, by means of the second polishing process, that is to say the polishing using a microstructured pad, it is possible to avoid the disadvantages of polishing using silica sol in the form of preferential chemical attack and polishing agent depletion from the edge to the center, but a particularly advantageous path-determined processing of the semiconductor surface without involvement of disadvantageous chip-removing removal mechanisms is realized at the same time.

The inventors assume that with the use of a pad surface that is elasticity-modulated to microstructured according to the invention, on the one hand so little OH— is passed to the semiconductor surface that preferential etching does not occur, and on the other hand so much OH— is passed thereto that an edge roll-off of the wafer thickness owing to depletion from the edge to the center is prevented.

For hydrodynamic reasons (continuity, incompressibility) it can be expected that the shear gradient in the liquid film between pad surface and semiconductor surface is particularly high where the microstructures of the pad surface come very close to the semiconductor surface or even touch it, and that this amplifies a path-determined reaction of the OH— with the semiconductor surface. Likewise, local friction heat along the paths described in particular by the hard polishing pad locations over the semiconductor surface may bring about a higher reaction rate there and thus support a path-determined chemical material removal.

In further investigations it was observed that the path-determined material removal that distinguishes the polishing using a microstructured pad that is essential to the invention (polishing process B in both methods according to the invention) can also be utilized for a targeted shaping of the semiconductor wafer.

The polishing pad usually contains a hard polishing pad carrier. The latter makes the polishing pad stiff and inelastic in the range up to a few millimeters. The polishing pad usually additionally contains a soft polishing pad backing (foam). The latter brings about an elasticity of the polishing pad in the range of centimeters and higher.

Therefore, the polishing pad can be prestressed by increased pressure of the retainer ring in such a way that a convex form arises. A concave thickness profile of the semiconductor wafer, that is to say an increase in thickness of the semiconductor wafer from the center thereof to the edge thereof, can be obtained by means of the second polishing step according to the invention.

If this is substantially chosen such that it acts complementarily to the expected edge roll-off of the wafer thickness in a subsequent double-side polishing using silica sol in accordance with the prior art, a highly plane-parallel target form of the semiconductor wafer is obtained at the end of the processing sequence.

The claimed invention and its advantageous effects are explained in greater detail below with reference to the figures.

FIG. 1 shows a semiconductor wafer that was processed (A) not according to the invention by methods known in the closest prior art and (B) according to the invention by polishing process B of the first method according to the invention, in each case on the basis of the example of a semiconductor wafer that is electronically inhomogeneous as a result of radially varying dopant incorporation during the crystal pulling process: the semiconductor wafer 1 contains a locally fluctuating concentration 2 of dopant (FIG. 1 (A), top). As a result of non-uniform material removal 4 on account of the bond strength fluctuations owing to the locally fluctuating dopant concentration 2, a surface unevenness 5 (FIG. 1 (A), bottom) arises as a result of processing by means of a polishing method according to the prior art (e.g. chemical mechanical polishing using an abrasive silica sol).

In contrast thereto, polishing process B of the first method according to the invention leads, by virtue of a uniform material removal and path-determined, deterministic processing, to a smooth surface having little damage and having high local flatness 6 (FIG. 1 (B)).

Figure 2:
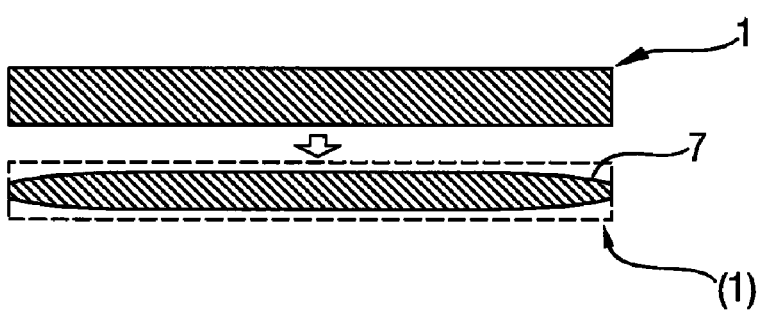
FIG. 2: Semiconductor wafer and the influence on the geometry thereof in the edge region: A) after processing not according to the invention, B) after processing according to the invention.
Figure 2:
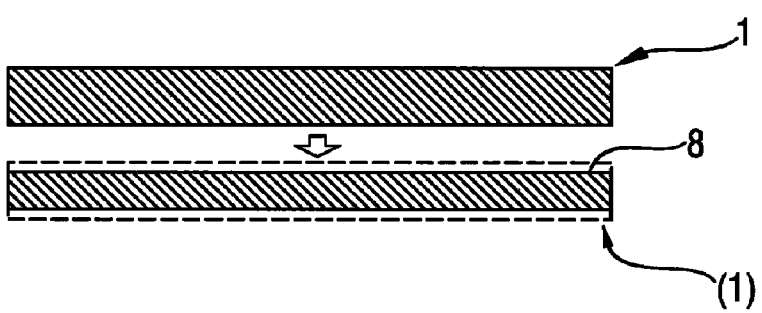

FIG. 2 shows a semiconductor wafer that was processed (A) not according to the invention by methods known in the prior art and (B) according to the invention by the polishing process B of the first method according to the invention, that is to say a specially adapted polishing using the microstructured pad, in each case on the basis of the example of a semiconductor wafer having homogeneous material properties. During processing by means of chemical mechanical polishing using abrasive silica sol according to the prior art, the depletion of the silica sol during the necessary transport from the edge to the center of the semiconductor wafer leads to an increased removal at the edge of the semiconductor wafer, and an undesirably convex form 7 arises (FIG. 2 (A)).

In contrast thereto, the polishing process B essential to the invention in the method according to the invention leads to a plane-parallel form 8 by means of a uniform material removal.

Figure 3:
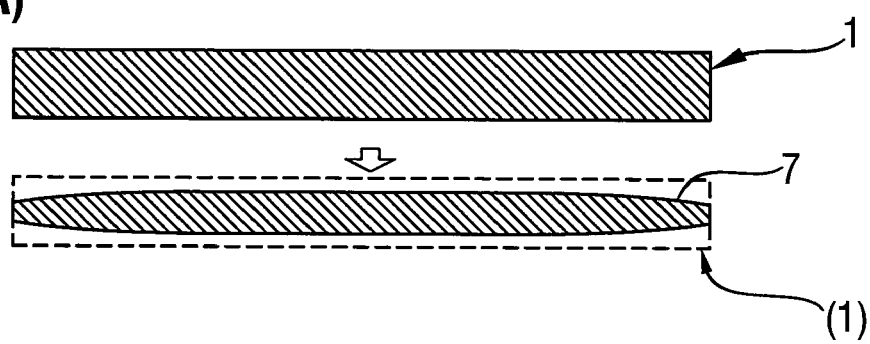
FIG. 3: Semiconductor wafer with convex thickness profile after chemical mechanical double-side polishing (A); and the change in the profile after processing according to the invention (B).
Figure 3:
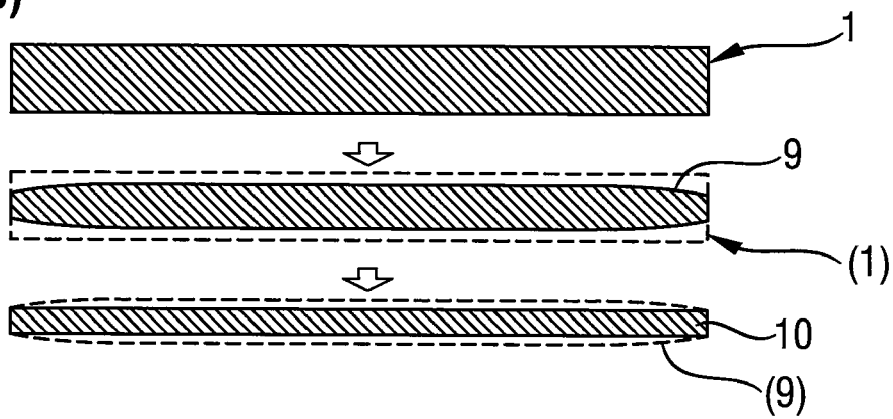

FIG. 3 shows a semiconductor wafer that was processed (A) not according to the invention by a simultaneous chemical mechanical double-side polishing (DSP) known in the prior art and using colloidally dispersed silica sol as the polishing agent containing abrasives supplied between two polishing pads containing no abrasives and (B) a wafer that was processed according to the invention by a polishing process A by means of DSP using silica sol and subsequently by a polishing process B using the microstructured polishing pad containing no substances coming into contact with the semiconductor surface which are harder than the processed semiconductor surface, and in the case of which a polishing agent is supplied which contains no substances with abrasive action and has a pH value of greater than or equal to 10.

Owing to the subsequent polishing process B, however, the DSP in the method according to the invention (FIG. 3 (B)) is carried out here with a material removal that is significantly reduced by comparison with the DSP according to the prior art.

During the DSP in the prior art, a total of between 10 µm and 50 µm of material is typically removed (cf. DE 101 32 504 C 1, for example). In this case, preferably an equal amount of material is removed from the front and rear sides of the semiconductor wafer, that is to say between 5 µm and 25 µm from each side.

In the method according to the invention according to FIG. 3 (B) preferably between 1 µm and 20 µm and particularly preferably between 3 µm and 10 µm of material is removed during the DSP (total material removal).

Owing to the further material removal as a result of the subsequent polishing process B using a microstructured pad, the total material removal in the method according to the invention is sufficiently great that all surface damage, roughnesses and chemical inhomogeneities originating from the preprocessing steps are reliably removed and a smooth, flat end surface results. Owing to the reduced DSP removal, in the polishing process A, however, the convexity 9 of the semiconductor wafer 1 is much less pronounced than in the comparative example of a DSP with high material removal in accordance with the prior art (7). The subsequently performed polishing process B using a microstructured polishing pad containing no additives coming into contact with the semiconductor surface which are harder than the semiconductor surface, and in the case of which a polishing agent is added which contains no substances with abrasive action and which has a pH value of greater than or equal to 10, on account of its path-determined removal, preferably removes material from elevated regions and thus levels the slightly convex semiconductor surface resulting from the first polishing step, but without bringing about an increased material removal in the edge region of the semiconductor wafer, with the result that overall an end surface of the semiconductor wafer having very good flatness 10 is obtained (FIG. 3 (B), bottom).

Figure 4:
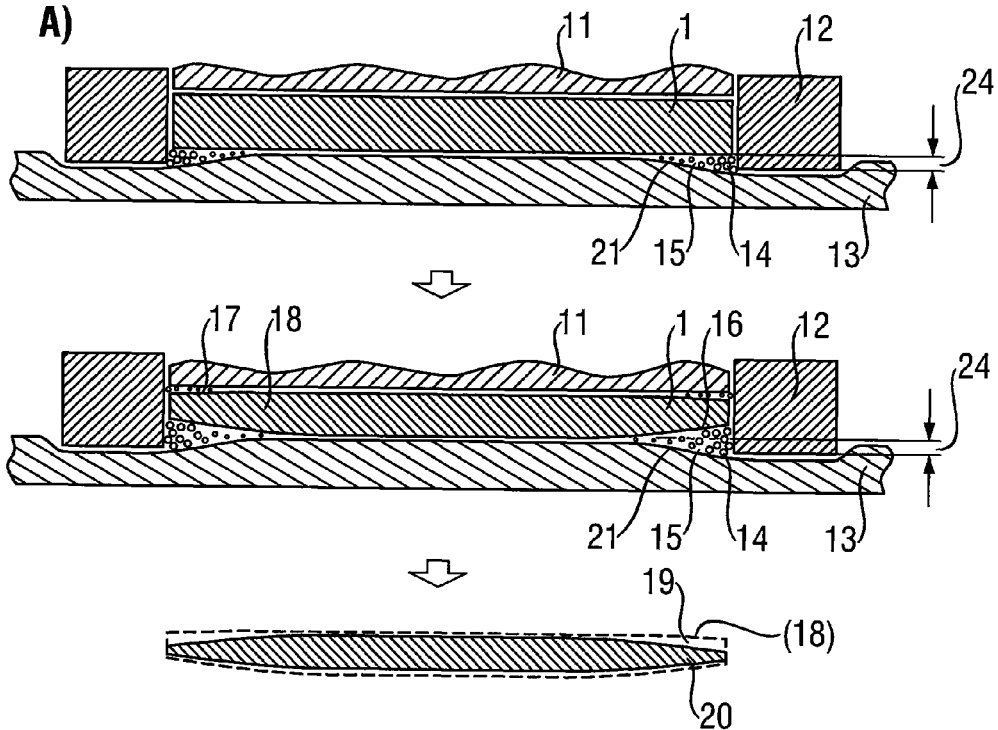
FIG. 4: Alteration of the geometry of a semiconductor wafer in the edge region thereof by A) processing not according to the invention, B) processing according to the second method according to the invention.
Figure 4:
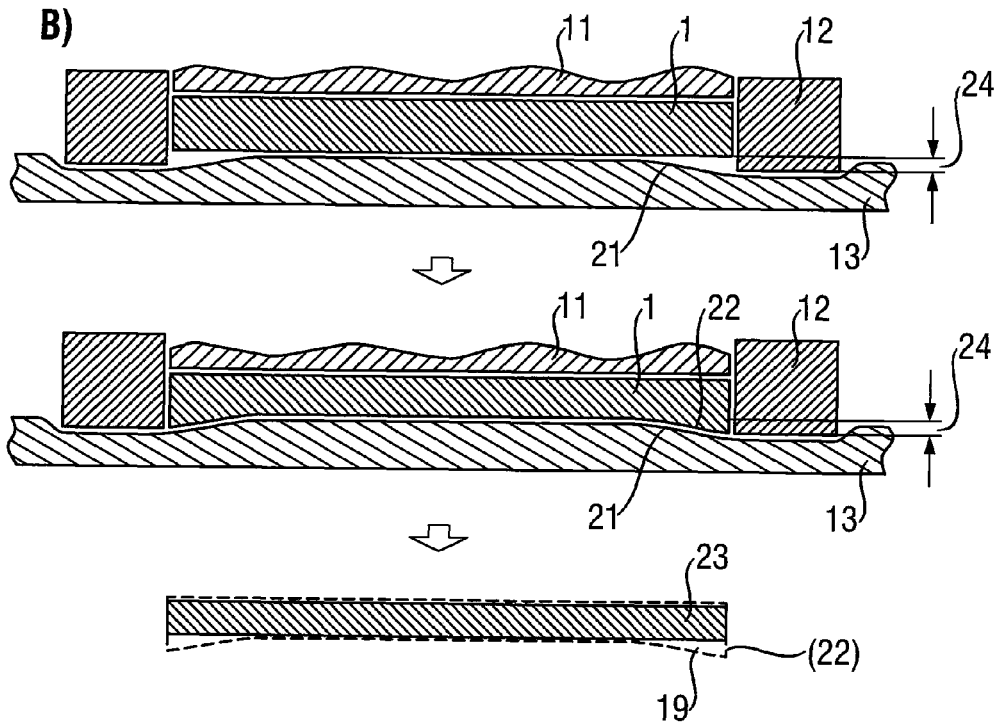

FIG. 4 (A) shows first of all how silica sol polishing processes that are known in the prior art attempt to avoid a convex form of the semiconductor wafer owing to silica sol depletion from the edge to the center of the semiconductor wafer. The illustration schematically shows the cross section through a semiconductor wafer 1 in the holding apparatus 11 (polishing head, "chuck") of a single-side polishing machine with retainer ring 12 and polishing pad 13. An attempt is made to counteract the depletion 15 of the silica sol 14 by means of a "negative overhang" 24 of the semiconductor wafer 1 over the retainer ring 12, whereby the polishing pad 13 is "stretched" (21), that is to say is forced away from the semiconductor wafer in the edge region of the semiconductor wafer 1 by the retainer ring and comes into better contact with the semiconductor wafer in the center of the semiconductor wafer on account of its elasticity. The term "overhang" denotes the jut-out of the semiconductor wafer over the holding apparatus when the target thickness is reached. The overhang is normally positive, that is to say that the semiconductor wafer projects from the retainer or guide apparatus at the end of the polishing process ("jut-out"), since, after all, the intention is for the semiconductor wafer to be polished and not for the holding apparatus to be worn by excessive application of pressure. However, the prior art discloses single-side and double-side polishing processes (DSP) in which material is removed for so long that the semiconductor wafer, at the end of the process, is thinner than the overhang of the retainer apparatus (retainer ring) during the single-side polishing or the carrier during the DSP. This is possible only on account of the elasticity of the polishing pad.

In the prior art, the convex form of the semiconductor wafer can actually be reduced somewhat by this "underhang" (negative overhang); right in the edge region, the silica sol depletion mechanism is always predominant, and a wafer having so-called "edge roll-off" of its thickness still results. FIG. 4 (A), top, shows the semiconductor wafer 1 prior to polishing with an "underhang" 24. FIG. 4 (A), middle, shows it after one side of the semiconductor wafer has already been polished, the semiconductor wafer has been turned and the other side of the semiconductor wafer has started to be polished. During the polishing of the first side, an "edge roll-off" of the first side of the semiconductor wafer has already arisen (17) on account of the silica sol depletion, and an edge roll-off of the other side of the semiconductor wafer arises (16) during the polishing of the other side. On account of the elasticity of the semiconductor wafer, the edge thereof yields somewhat to the dynamic pressure of the silica sol 14 during the polishing of its other side, as a result of which, during the polishing of the other side of the semiconductor wafer, a somewhat smaller edge roll-off arises and the semiconductor wafer elastically assumes an almost planoconvex form 18. After the removal of the semiconductor wafer from the polishing receptacle apparatus after the end of polishing, when the semiconductor wafer has elastically relaxed again, an asymmetrical edge roll-off 20 with an asymmetrically biconvex form 19 of the semiconductor wafer is manifested (FIG. 4 (A), bottom).

An analogously similar result is obtained if both sides of the semiconductor wafer are not polished sequentially on a single side, but rather simultaneously on both sides by means of DSP and the polishing is performed with an "underhang" of the semiconductor wafer at the end of polishing under the thickness of the carrier of the DSP apparatus. A symmetrically biconvex form of the semiconductor wafer results in this case.

FIG. 4 (B) illustrates an embodiment of the first method according to the invention, namely the case where polishing process B precedes the double-side DSP polishing process A. Firstly, therefore, the polishing using abrasive-free polishing agent and using a microstructured polishing pad is carried out (FIG. 4 (B), top). In this case, the retainer ring 12 projects beyond the end thickness of the semiconductor wafer, that is to say that the wafer is polished with an "underhang". The retainer ring 12 compresses the long-wave elastic microstructured polishing pad 13 at the edge region of the wafer, thus resulting in a higher material removal in the center of the semiconductor wafer (21). Since polishing according to the invention using a microstructured pad without abrasive-containing polishing agent does not give rise to increased removal in the edge region, the pad form (21) having a bulge in this way leads directly to a correspondingly (plano-)concave wafer form having an increased thickness 22 in the edge region of the semiconductor wafer (FIG. 4 (B), middle). If the polishing process B according to the invention using a microstructured pad is carried out sequentially on both sides with an "underhang", this results in a biconcave wafer form (symmetrical increase in thickness in the edge region; not shown). The same result is yielded by a simultaneous double-side DSP using a microstructured pad (likewise not shown). If this planoconcave or biconcave wafer is then finally subjected to the second simultaneous double-side polishing process A using a silica sol, the increased material removal which then occurs in the edge region then reduces the edge elevation previously introduced, on account of the silica sol depletion.

The preferred "underhang" is dependent on the elasticity of the microstructured polishing pad and is between 0.1 μm and 0.1 mm.

Preferably, the desired total material removal, the magnitude of which is determined by the maximum damage depth of the mechanical prior processes, is divided between the first polishing process B using abrasive-free polishing agent and using a microstructured polishing pad and the second simultaneous double-side polishing process A using silica sol in such a way that precisely a maximally plane-parallel end form of the wafer is produced. Now that the solution according to the invention has been found and understood, this can be realized relatively easily and even with a substantially free choice for the proportional division of the partial removals between the two polishing steps since, firstly, by way of the amount of carrier "underhang" under the retainer ring during the first polishing process, the degree of concavity obtained in the meantime can be influenced within wide limits and, secondly, by way of the "underhang" of the wafer under the thickness of the carrier during subsequent second DSP using silica sol, the decrease in edge thickness on account of the polishing agent depletion can be intensified (overhang) or suppressed (deep "underhang").

While exemplary embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for processing a semiconductor wafer, comprising polishing by a polishing process A which effects material-removing processing of both sides of the semiconductor surface simultaneously and in which a polishing pad is used which contains no substances with abrasive action, and in which a polishing agent is added which contains substances with abrasive action; and polishing by a polishing process B with no abrasive particles, which effects material-removing processing of either one or both sides of the semiconductor wafer and in which a polishing pad is used which has a microstructured surface and which contains no materials coming into contact with the semiconductor wafer which are harder than the semiconductor material, and in which a polishing agent is added which has a pH value of greater than or equal to 10 and which contains no substances with abrasive action.

2. The method of claim 1, wherein the semiconductor wafer is composed of silicon and all materials of the polishing pad used in polishing process B which come into contact with the semiconductor surface have a Mohs hardness of six or less.

3. The method of claim 2, wherein the polishing agent added in polishing process A contains silica sol ($SiO_2$).

4. The method of claim 3, wherein the pH value of the polishing agent added in polishing process B is established by addition of potassium hydroxide (KOH) or potassium carbonate ($K_2CO_3$).

5. The method of claim 2, wherein the pH value of the polishing agent added in polishing process B is established by addition of potassium hydroxide (KOH) or potassium carbonate ($K_2CO_3$).

6. The method of claim 2, wherein the microstructures of the polishing pad used in polishing process B are formed from uniform elements arranged on the pad surface, wherein the height of the elements is between 1 μm and 1 mm and the distance between the elements is between 10 μm and 10 mm.

7. The method of claim 1, wherein the microstructures of the polishing pad used in polishing process B are formed from uniform elements arranged on the pad surface, wherein the height of the elements is between 1 μm and 1 mm and the distance between the elements is between 10 μm and 10 mm.

8. The method of claim 7, wherein the height of the elements is between 10 μm and 250 μm and the distance between the elements is between 50 μm and 5 mm.

9. The method of claim 1, wherein a polishing process A is carried out before polishing process B.

10. The method of claim 1, wherein a polishing process A is carried out after polishing process B.

11. The method of claim 1, wherein the polishing pad which has a microstructured surface contains inorganic particles having a hardness less than the hardness of the semiconductor materials.

12. A method for processing a semiconductor wafer, comprising polishing by a polishing process A which effects material-removing processing of both sides of the semiconductor surface simultaneously and in which a polishing pad is used which contains no substances with abrasive action, and in which a polishing agent is added which contains substances with abrasive action; and polishing by a polishing process B with no abrasive particles, which effects material-removing processing of either one or both sides of the semiconductor wafer and in which a polishing pad is used which has a microstructured surface and which contains no materials coming into contact with the semiconductor wafer which are harder than the semiconductor material, and in which a polishing agent is added which has a pH value of greater than or equal to 10 and which contains no substances with abrasive action, wherein polishing process A firstly produces a planoconvex or biconvex semiconductor wafer and polishing process B subsequently produces a more plane-parallel semiconductor wafer, and wherein a polishing process A is carried out before a polishing process B.

13. The method of claim 12, wherein the semiconductor wafer, during polishing process A, lies in a holding apparatus having a retainer ring that surrounds the edge of the semiconductor wafer and thereby prevents the semiconductor wafer from leaving the holding apparatus during the polishing process, wherein the retainer ring projects beyond the plane in which that side of the semiconductor wafer which is polished during polishing process A is located at the end of polishing process A.

14. The method of claim 12, wherein the overhang of the retainer ring over the polished side of the semiconductor surface is between 0.1 μm and 0.1 mm.

15. The method of claim 12, wherein between 1 μm and 20 μm of material is removed from the semiconductor wafer during polishing process A.

16. The method of claim 15, wherein step (b) comprises a process of grinding the semiconductor wafer between two cup grinding disks, wherein the semiconductor wafer is guided radially by a thin guide ring, which effects a rotation of the semiconductor wafer, and is guided axially by water or air cushions provided on the front and rear sides of the semiconductor wafer, and the cup grinding disks are advanced onto the semiconductor wafer symmetrically with rotation in opposite directions.

17. The method of claim 12, wherein a total of between 3 μm and 10 μm of material is removed from the semiconductor wafer during polishing process A.

18. A method for producing a semiconductor wafer, comprising the following steps in the order indicated:
   (a) separating a semiconductor single crystal into wafers;
   (b) simultaneously processing both sides of the semiconductor wafer by means of chip-removing processing;
   (c) polishing the semiconductor wafer, comprising a polishing process A, which effects material-removing processing of both sides of the semiconductor wafer surfaces simultaneously and in which a polishing pad is used which contains no substances with abrasive action, and in which a polishing agent is added which contains substances with abrasive action; and a polishing process B, which effects material-removing processing of either one or both sides of the semiconductor surface and in which a polishing pad is used which has a microstructured surface and which contains no materials coming into contact with the semiconductor surface which are harder than the semiconductor surface, and in which a polishing agent is added which has a pH value of greater than or equal to 10 and which contains no substances with abrasive action; and
   (d) chemical mechanical polishing of at least one side of the semiconductor wafer, wherein less than 1 μm is removed.

19. The method of claim 18, wherein step (b) comprises a process in which a plurality of semiconductor wafers are processed and in which each semiconductor wafer lies in freely movable fashion in a cutout in one of a plurality of carriers that are caused to rotate by means of a rolling apparatus, and is thereby processed on a cycloidal trajectory, wherein the semiconductor wafers are processed in material-removing fashion between two rotating working disks, wherein each working disk comprises a working layer containing bonded abrasive.

20. The method of claim 18, wherein step (b) is a plane-parallel lapping process.

21. The method of claim 18, wherein an additional processing step, comprising single-side grinding of one or both sides of the semiconductor wafers by means of a cup grinding disk, is effected between steps (b) and (c).

22. The method of claim 18, wherein an additional processing step, comprising etching of the semiconductor wafer, is effected between steps (b) and (c).

23. The method of claim 22, wherein the etching of the semiconductor wafer is effected between the single-side grinding and the polishing of the semiconductor wafer in accordance with step (c).

24. The method of claim 18, wherein in step (c), polishing process A is carried out before polishing process B.

25. The method of claim 18, wherein in step (c), polishing process A is carried out after polishing process B.

26. A method for producing a semiconductor wafer, comprising the following steps in the order indicated:
   (a) separating a semiconductor single crystal into wafers;
   (b) simultaneously processing both sides of the semiconductor wafer by means of chip-removing processing;
   (c) polishing the semiconductor wafer, comprising a polishing process A, which effects material-removing processing of both sides of the semiconductor wafer surfaces simultaneously and in which a polishing pad is used which contains no substances with abrasive action, and in which a polishing agent is added which contains substances with abrasive action; and a polishing process B, which effects material-removing processing of either one or both sides of the semiconductor surface and in which a polishing pad is used which has a microstructured surface and which contains no materials coming into contact with the semiconductor surface which are harder than the semiconductor surface, and in which a polishing agent is added which has a pH value of greater than or equal to 10 and which contains no substances with abrasive action; and
   (d) chemical mechanical polishing of at least one side of the semiconductor wafer, wherein less than 1 μm is removed, wherein in step (c), polishing process A is carried out before polishing step B, and wherein polishing process A firstly produces a planoconvex or biconvex semiconductor wafer and polishing process B subsequently produces a more plane-parallel semiconductor wafer.

27. The method of claim 26, wherein between 1 μm and 20 μm of material is removed during polishing process A.

\* \* \* \* \*